United States Patent

[11] 3,611,060

[72] Inventors Rowland E. Johnson
Dallas;
Robert W. Haisty, Richardson, both of Tex.
[21] Appl. No. 877,291
[22] Filed Nov. 17, 1969
[45] Patented Oct. 5, 1971
[73] Assignee Texas Instruments Incorporated
Dallas, Tex.

[54] THREE TERMINAL ACTIVE GLASS MEMORY ELEMENT
5 Claims, 4 Drawing Figs.

[52] U.S. Cl. .......... 317/234 R, 317/234 V, 317/234 F, 317/234 S, 317/235 K, 317/235 P
[51] Int. Cl. .......... H01l 11/00
[50] Field of Search .......... 317/235 (28), 235 (25), 234 (3.1), 234 (8), 234 (10), 234 V, 234 F, 235 K, 235 P, 234 S

[56] References Cited
UNITED STATES PATENTS

| | | | |
|---|---|---|---|
| 3,436,624 | 4/1969 | Wesemyer | 317/237 |
| 3,527,962 | 9/1970 | Ovshinsky | 307/252 |
| 3,271,591 | 9/1966 | Ovshinsky | 307/88.5 |

*Primary Examiner*—John W. Huckert
*Assistant Examiner*—Martin H. Edlow
*Attorneys*—James O. Dixon, Andrew M. Hassell, Harold Levine, Melvin Sharp, Gary C. Honeycutt, Henry T. Olsen, Michael A. Sileo, Jr. and John E. Vandigriff

ABSTRACT: Disclosed is a three terminal switching device using a nonoxide glass as the active elemental material therein. In one specific embodiment the switch includes a first nonoxide active glass film evaporated on a conductive base of aluminum. A conductive gold strip is formed over a portion of the first nonoxide glass film and a second nonoxide active glass film is formed partially over the gold strip and the first glass film. Electrical contacts are made to the conductive base, the conductive strip and the second nonoxide glass film. With a biasing voltage applied to the base contact and the film contact, a voltage pulse of proper polarity applied to the gold strip contact turns the device on, and while in this on condition, a voltage pulse of the opposite polarity turns the device off.

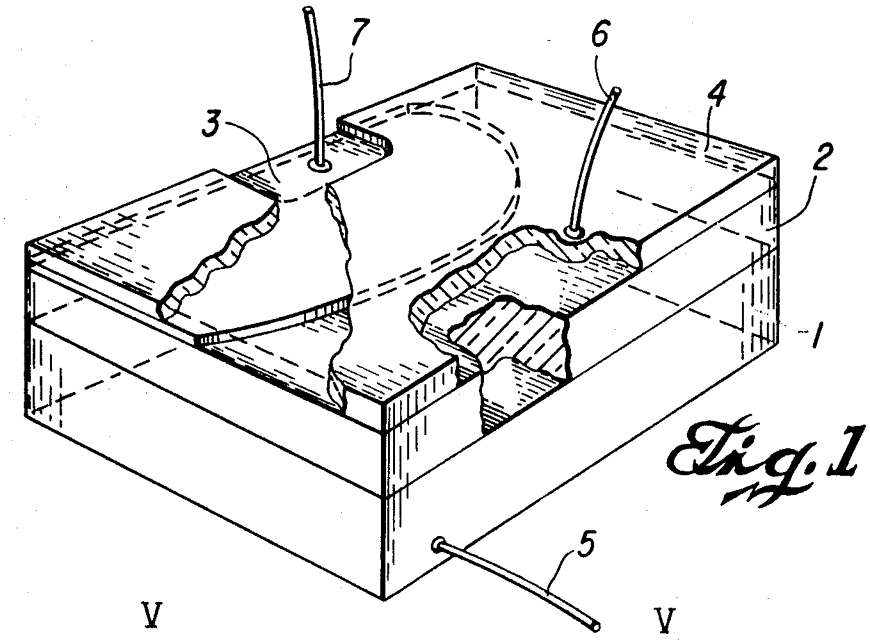
Fig. 1
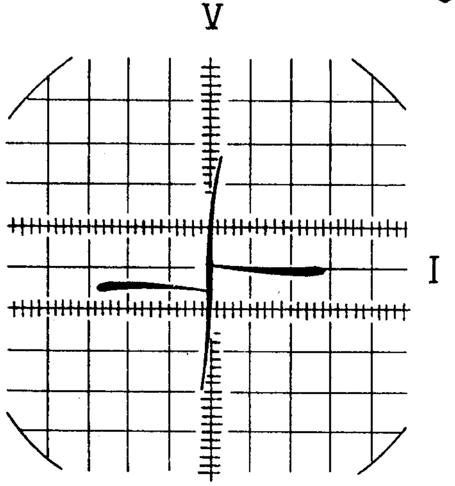
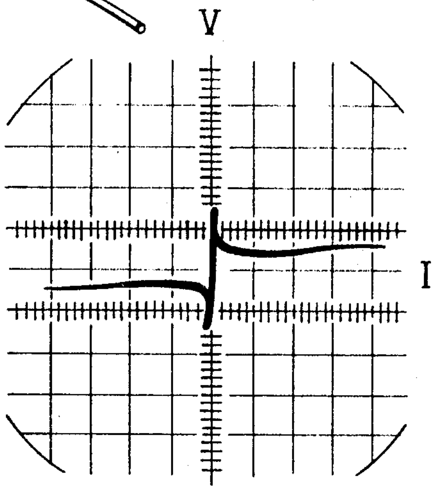
Fig. 2 Fig. 3
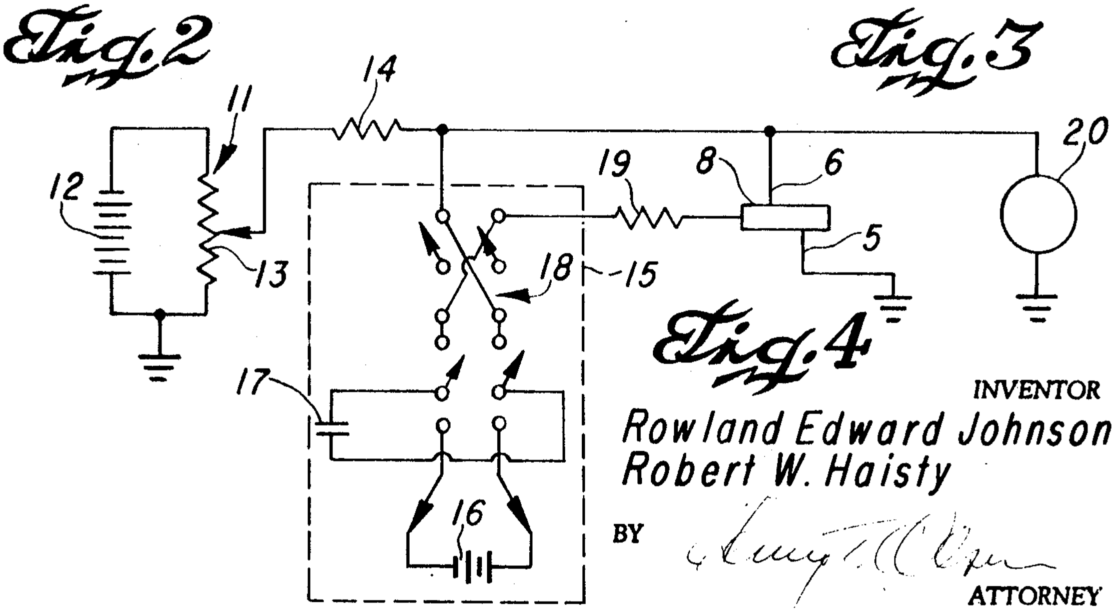
Fig. 4
INVENTOR
Rowland Edward Johnson
Robert W. Haisty
BY [signature]
ATTORNEY

THREE TERMINAL ACTIVE GLASS MEMORY ELEMENT

This invention relates to an electrical switching device and, more particularly, to a solid state switching device which may be switched to a relatively low resistance state under certain conditions and which may be returned to a high resistance state upon the application of another different condition.

Briefly, the invention comprises a pair of nonoxide active glass layers with electrical contacts connected to each layer. A conductive metal layer partially separates the two glass layers and has a third electrical contact connected thereto to serve as a trigger electrode for increasing or decreasing selectively the resistance of an electrical current-carrying path through the glass layers.

FIG. 1 is an isometric view, partially sectioned, of the preferred embodiment of the invention;

FIGS. 2 and 3 indicate oscilloscope traces of the device in two and three terminal operations respectively; and FIG. 4 is a schematic diagram of a circuit utilized for operation and testing of the device of FIG. 1.

As shown in FIG. 1, the three terminal device in accordance with the invention is formed upon a conductive base 1, preferably of aluminum although any other suitable conductive material as, for example, copper may be utilized. A nonoxide glass film 2 is laminated over the conductive layer and a thin conductive strip, for example, of gold is layered over a portion of glass film 2. A second glass film layer or laminate 4 is layered over the first glass film 2 and conductive layer 3. Since, as is explained herein, the active region of the device is determined by relative contact area and not by layering of glass layers, the area of contact between the first and second glass layers should not be considered as shorting the device.

The invention may be considered as the placement of a conductive sheet containing a small hole within a glass body with the glass extending upon both sides thereof and through the hole in the conductive sheet. However, with the relative conductivity of the glass and the close spacing and tolerance of the hole to be considered, such an arrangement is impractical. Since, for the purposes of the invention, the glass outside of the active region has a resistance characteristic of an insulator, the same result can be achieved by the preferred construction.

A first electrical contact 5 is provided to the conductive base 1 by any suitable means. Since the base 1 is in intimate contact both physically and electrically with first glass layer 2, the electric contact 5 forms the electrical contact for this region as well. A second electrical contact 6 is connected to the second glass layer 4. This contact 6 is preferably adjacent an edge of the conductive strip 3 whereby the electrical field within the combined first and second layers is concentrated adjacent said conductive layer. A third contact 7 to the gold layer is provided.

The aforementioned construction is achieved by evaporating or depositing a first glass layer 2 having a composition of 55 atomic percent Te, 38 atomic percent As, 4 atomic percent Ge, and 3 atomic percent Si (weight percent; 68.5 percent Te, 22.8 percent As; 2.8 percent Ge; and 0.89 percent Si, respectively) upon an aluminum substrate. A portion of this glass film 2 is then masked and a conductive layer 3 is placed thereon as by evaporation or vacuum metallization. The vacuum metallizing should be thick enough to provide good electrical contact to the conductive film 3. Thus, if the glass layer alloy is deposited upon a polished aluminum base for about 2 minutes at a red heat, a thickness of about 7,370 angstroms is obtained. Following a gold conductive strip flash evaporation, a relatively thin second glass layer is placed thereover, which layer can be obtained by a 1 minute evaporation of the same glass composition to obtain a glass layer approximately 4,450 angstroms thick over the gold and glass layers. The three contacts to the respective areas may be provided by platinum wire contacts soldered thereto.

A circuit for testing and operating the aforementioned device is depicted in FIG. 4 with contacts 5, 6 and 7, respectively, connected therein. A biasing source 11 provides a variable power supply for applying voltage between contacts 5 and 6. This variable power supply comprises a DC source 12 and variable resistance 13. By varying the resistance 13, the voltage across the nonoxide glass layers 2 and 4 may be varied to approach a threshold value, with a current-limiting resistor 14 provided therebetween.

A DC switching source 15 is also provided to raise or lower the field present in the active region of the device. As indicated at 16, the source comprises a variable 0–1,000 volts DC supply including variable capacitance 17. The complement of reversing switches 18 and capacitance 17 are effective to reverse polarity of the voltage applied to the trigger contact 7 of the device. Again a current-limiting resistance 19 may be provided to protect the trigger contact. An oscilloscope 20 is connected to contact 6.

FIG. 2 depicts the operation of the device as a two terminal device between the top contact 6 and bottom contact under the threshold loading characteristics of the aforementioned circuit.

To obtain the characteristics of FIG. 2, it is necessary that the biasing voltage be applied by the source 12 and then, by discharging a pulse of a first polarity from capacitance 17, the symmetrical conduction of FIG. 2 occurs. To obtain nonconduction, the reversing switches 18 are thrown and a discharge from capacitor 17 of opposite polarity returns the device to a nonconducting condition.

While the invention has been disclosed by way of the preferred embodiment thereof, it will be apparent that other materials of a similar type may be substituted therein without departing from the spirit and scope of the invention, for example, the active glass may be an arsenic-tellurium alloy.

We claim:

1. A three terminal memory device comprising:
   a. a first layer of active glass having an electrical contact means thereon, said active glass comprising an arsenic-tellurium alloy;
   b. a metallic conductive strip overlying and in intimate contact with a portion of said first layer;
   c. a second layer of active glass comprising an arsenic-tellurium alloy overlying and in intimate contact with the exposed region of said first layer of active glass and with said metallic strip said second layer having electrical contact means thereon; and
   d. means for applying an electrical pulse to said metallic strip, a pulse of one polarity effecting operation of the memory device in a first mode characterized by a relatively low resistance between said electrical contact means, said first mode of operation continuing after termination of said pulse until a pulse of opposite polarity is applied to said metallic strip, whereafter said device operates in a second mode characterized by relatively high resistance between said second mode of operation continuing after termination of said opposite polarity pulse until a subsequent pulse of said one polarity is applied to said metallic strip.

2. A memory device as recited in claim 1, wherein said alloy further contains silicon and germanium.

3. A memory device as recited in claim 2, wherein one of said glass layers consists essentially of 55 atomic percent Te, 38 atomic percent As, 4 atomic percent Ge, and 3 atomic percent Si.

4. A memory device as recited in claim 3, wherein both glass layers are of the aforementioned composition.

5. A memory device as recited in claim 3, wherein said conductive strip is gold.